(12) United States Patent
Sangam et al.

(10) Patent No.: US 8,222,910 B2
(45) Date of Patent: Jul. 17, 2012

(54) METHOD AND APPARATUS FOR SUB-ASSEMBLY ERROR DETECTION IN HIGH VOLTAGE ANALOG CIRCUITS AND PINS

(75) Inventors: Dilip Sangam, Saratoga, CA (US);
Hendrik Santo, San Jose, CA (US);
Sean Chen, Sunnyvale, CA (US);
Minjong Kim, San Jose, CA (US);
Sivaprakash Kannan, Santa Clara, CA (US); Balaji Virajpet, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 391 days.

(21) Appl. No.: 12/504,308

(22) Filed: Jul. 16, 2009

(65) Prior Publication Data
US 2011/0012609 A1 Jan. 20, 2011

(51) Int. Cl.
*G01R 31/02* (2006.01)
(52) U.S. Cl. .............................. 324/750.3; 324/757.02
(58) Field of Classification Search .................. None
See application file for complete search history.

(56) References Cited

U.S. PATENT DOCUMENTS

| | | | |
|---|---|---|---|
| 3,991,302 A | 11/1976 | Danner | |
| 4,044,244 A * | 8/1977 | Foreman et al. | ............. 714/724 |
| 4,255,792 A | 3/1981 | Das | |
| 4,907,230 A | 3/1990 | Heller et al. | |
| 6,070,252 A | 5/2000 | Xu et al. | |
| 6,404,949 B1 | 6/2002 | Sargent, IV et al. | |
| 6,911,700 B2 * | 6/2005 | Okamoto | ..................... 257/355 |
| 7,548,105 B2 * | 6/2009 | Shrank et al. | ................. 327/276 |
| 2008/0282119 A1 * | 11/2008 | Suzuki et al. | ................. 714/718 |

OTHER PUBLICATIONS

International Search Report and Written Opinion for international Application No. PCT/US2010/041991, mailing date Sep. 10, 2010, 13 pages.

* cited by examiner

*Primary Examiner* — Vinh Nguyen
(74) *Attorney, Agent, or Firm* — Fish & Richardson P.C.

(57) ABSTRACT

The innovation relates to systems and/or methodologies for error detection during sub-assembly in high voltage analog circuits. A signal driver communicates test signals to one or more high voltage analog circuits, and a state machine compares the electrical and/or thermal responses of the high voltage analog circuits to a set of predetermined expected results (e.g., signatures). The signal driver and state machine can be incorporated into the high voltage analog circuits. The expected results can be stored in the target circuits in the form of look-up tables, matrices, and so forth. Errors, such as, dry solders and bridge solders can be determined based on the comparison of the obtained responses to the expected signatures.

18 Claims, 6 Drawing Sheets

METHOD AND APPARATUS FOR SUB-ASSEMBLY ERROR DETECTION IN HIGH VOLTAGE ANALOG CIRCUITS AND PINS

BACKGROUND

1. Field

The subject innovation relates generally to testing integrated circuits, and more particularly to systems and method for testing high voltage analog integrated circuits and pins prior to final printed circuit board assembly using BIST (built-in self-test) techniques.

2. Background

Multi-layer printed circuit boards (PCBs) and integrated circuits (ICs) are common in a wide array of electrical technologies and applications. The multi-layer PCBs and non-lead frame ICs can make efficient use of ever shrinking electrical packages, and reduce the overall resources necessary to produce an electrical component or set of components. However, testing the components can be difficult, due to a lack of connections between ICs accessible via probes. Moreover, the separation between the pins can be on the order of 0.1 mm, and using larger boards can result in undesirable consequences, such as larger products, increased trace pitch, and so forth. Typically, a large quantity of manufacturing and field faults in circuit boards are due to solder joints, imperfections in board connections, or the bonds and bond wires from IC pads to pin lead frames.

Figure 1:
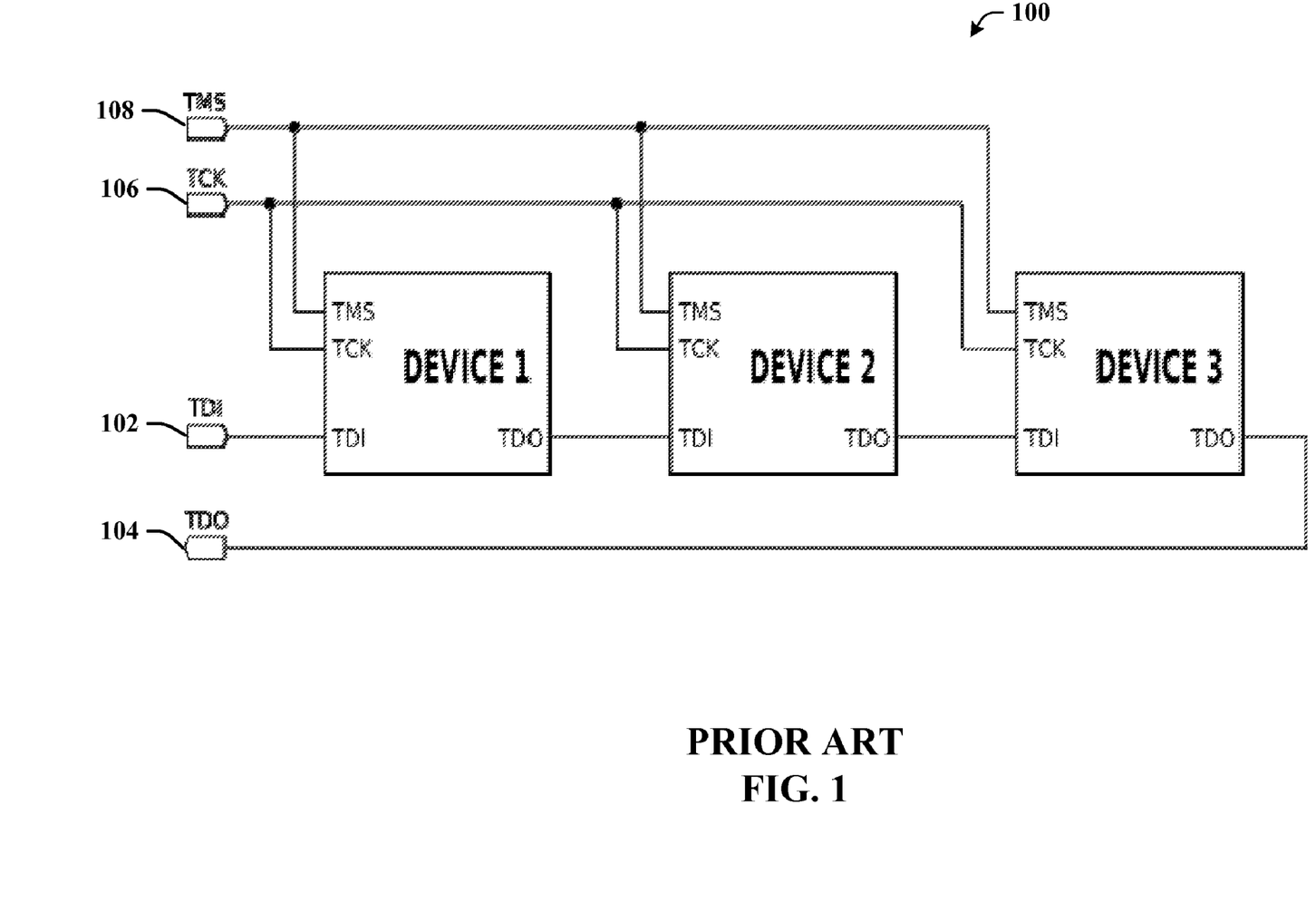
FIG. 1 is an example illustration of a typical JTAG interface in accordance with an aspect of the subject specification.

FIG. 1 illustrates an example standard test access port and boundary scan architecture (commonly called a JTAG interface) in accordance with an aspect of the subject specification. The JTAG interface 100 shown can be used for accessing sub-blocks of integrated circuits, and/or debugging embedded systems. In addition, the JTAG interface 100 can be used to transfer data into non-volatile memory. In general, JTAG interfaces 100 can provide convenient "back-door" access into ICs and electrical systems.

Current ICs typically have internal registers that are linked together in sets of scan chains. External manipulation of the scan chains enables testing of the combinational logic in the IC after it is mounted on a PCB, and/or possibly while in a functioning system. When combined with a built-in self-test (BIST), the JTAG scan chains enable a low overhead, embedded solution to testing an IC for certain static faults (e.g., shorts, opens, logic errors, etc.).

As illustrated, the JTAG interface 100 includes a test data in (TDI) 102, a test data out (TDO) 104, a test clock (TCK) 106, and a test mode select (TMS) 108. In addition, the JTAG interface 100 can include a test reset (not shown). The JTAG protocol (e.g., IEEE 1149.1) is a serial communication system, as can be appreciated based on its single data line (e.g., TDI). One bit of data is transferred per TCK 106 clock pulse at the TDI 102 and TDO 104 pins, respectively.

Typically, the scan chain mechanism does not provide for diagnosing or testing timing, temperature or other dynamic operational errors that may occur. In addition, the JTAG interface 100 is limited to digital ICs and some low voltage analog ICs (e.g., under five volts), and does not cover high voltage (HV) analog circuits. Consequently, it would be desirable to have an onboard automated technique for identifying errors in HV analog circuits prior to final assembly.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with one or more aspects and the corresponding disclosure thereof, various aspects are described in connection with sub-assembly error detection in high voltage analog circuits and pins. A built in self test (BIST) process is invoked by a serial register accessible interface which shows the mapping of pins to register bits. Faults such as stuck-low, stuck-high, floating and adjacent pin bridging can be identified resulting in faster board assembly diagnostics and rework.

According to related aspects, an apparatus for sub-assembly error detection in high voltage analog circuits is provided. A signal driver generates a set of electrical test signals, and communicates the test signals to one or more pins of a high voltage analog circuit, wherein high voltage includes voltages of five volts or higher, a reference component maintains a set of expected responses to the test signals for the high voltage analog circuit, and a state machine obtains an actual response of the high voltage analog circuit to the test signals, and determines existence of an error by comparing the actual response to the set of expected responses maintained by the reference component.

Another aspect relates to a method for error detection in high voltage analog circuits. The method includes generating a set of electrical test signals, communicating the test signals to one or more pins of a high voltage analog circuit, wherein high voltage includes voltages of five volts or higher, maintaining at least one of a set of expected electrical responses or a set of expected thermal responses to the test signals, obtaining an actual response of the high voltage analog circuit to the test signals, and determining existence of at least one error by comparing the actual response to the set of expected responses.

Yet another aspect relates to an apparatus for sub-assembly error detection in high voltage analog circuits and pins. The apparatus includes means for generating a set of electrical test signals, means for communicating the test signals to one or more pins of a high voltage analog circuit, wherein high voltage includes voltages of five volts or higher, means for maintaining at least one of a set of expected electrical responses or a set of expected thermal responses to the test signals, means for obtaining an actual response of the high voltage analog circuit to the test signals, and means for determining existence of at least one error by comparing the actual response to the set of expected responses.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The above and other objects and advantages of the present innovation will be apparent upon consideration of the following detailed description, taken in conjunction with the accompanying drawings, in which like reference characters refer to like parts throughout, and in which.

DETAILED DESCRIPTION

Various aspects are now described with reference to the drawings. In the following description, for purposes of explanation, numerous specific details are set forth in order to provide a thorough understanding of one or more aspects. It will be evident, however, that such aspect(s) may be practiced without these specific details.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Figure 2:
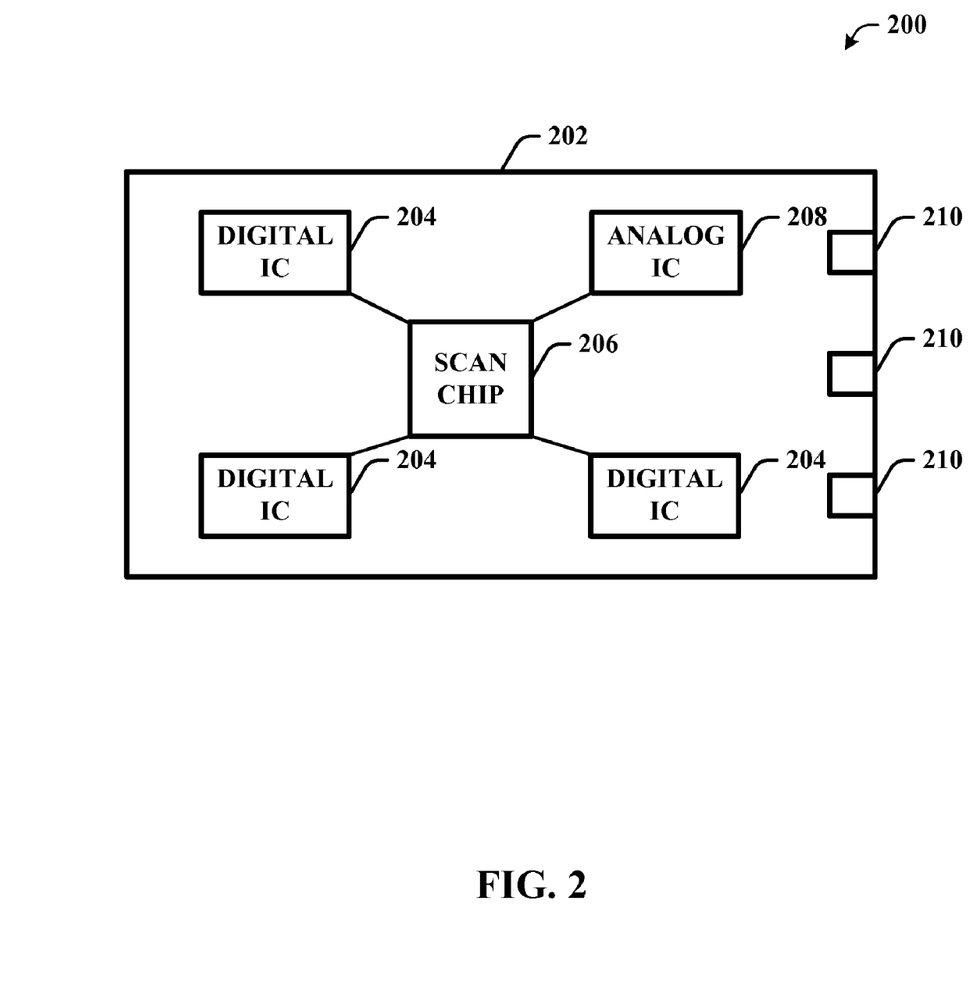
FIG. 2 is an example illustration of an electrical assembly in accordance with an aspect of the subject specification.

FIG. 2 is an example illustration of an electrical assembly in accordance with an aspect of the subject specification. The electrical assembly 200 includes a printed circuit board (PCB) 202. The most common technique for assembling a system similar to that of the electrical assembly 200 is via a reflow soldering process. Reflow soldering involves coating the PCB 202 with a solder paste along predetermined landing patterns (e.g., attachment pads), wherein the solder paste is a mixture of powered solder and a flux material. Subsequently, a set of integrated circuits (e.g., ICs, chips, etc.) can be situated on the landing patterns. For instance, an automated pick and place system is a common method of locating a set of chips on the PCB 202. Furthermore, the chips can include a plurality of digital ICs 204, a JTAG controller 206, an analog IC 208, and/or a set of connectors 210.

The solder paste temporarily maintains the chips at the specified locations on the PCB 202 until the assembly is heated. When heated the flux accelerates melting of the powdered solder, and lead pins of the chips are soldered to the attachment pads of the PCB 202. The assembly can be heated via a plurality of techniques, including but not limited to convection oven, infrared lamp, hot air pencil, etc. This is typically considered a sub-assembly stage of a manufacturing process. Final assembly can include integrating the assembly 200 into virtually any electronic system, such as a laser printer, mobile phone, television, and so forth.

It may desirable to test the assembly 200 prior to final assembly to detect errors in order to save time, resources, and increase the overall efficiency of the manufacturing process. As discussed supra, the JTAG controller 206 enables testing digital ICs 204 included in a scan chain for logic errors, shorts, opens, etc. For instance, the JTAG controller 206 can be used to check for dry solders, wherein the pins of digital ICs 204 are not sufficiently connected to the assembly 200. Testing digital pins is relatively simple, because of the limited number of values that need to be checked. For instance, the JTAG controller 206 may only be required to check pins of the digital ICs 204 for high values (e.g., 5V) or low values (e.g., 2V). On the other hand, determining errors for analog pins can be more difficult, due to the wide range of possible values. For instance, the analog IC 208 could have values covering the entire spectrum of zero (0) to five (5) volts. Moreover, there can be a plurality of behaviors associated with analog circuits and pins, for instance, analog pins found in a wide array of consumer goods can have up to nine (9) distinct associated behaviors.

As mentioned supra, JTAG (e.g., IEEE 1149.1-1149.4) does not provide for testing high voltage analog assemblies (e.g., ICs, pins, etc.). Therefore, in order to test high voltage assemblies and pins it is typically necessary to have a technician manually perform quality assurance inspections to check connections for soldering errors in high voltage assemblies. Clearly, such a process can be time consuming and inefficient. Discussed in greater detail below are techniques for automatically checking high voltage assemblies and pins during the sub-assembly stage. The term high voltage as used herein is intended to refer to voltages of five (5) volts or higher.

Figure 3:
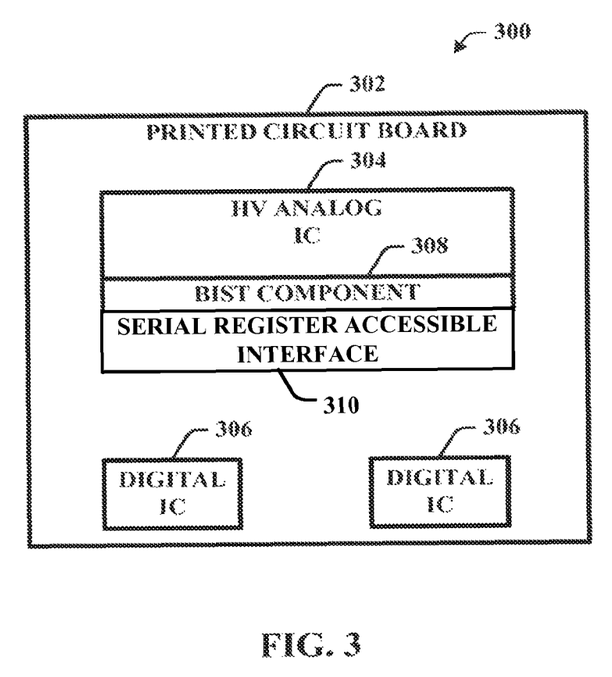
FIG. 3 illustrates an example electrical assembly in accordance with an aspect of the subject specification.

FIG. 3 illustrates an example electrical assembly in accordance with an aspect of the subject innovation. The assembly 300 includes a printed circuit board (PCB) 302 having one or more high voltage (HV) analog integrated circuits (ICs) 304, and a set of digital ICs 306. For example, a typical flat panel television set can contain twelve (12) to sixteen (16) ICs, each having a plurality of high voltage analog pins. As discussed previously, the digital ICs 306 can be tested for pin soldering errors, logic errors, and so forth via a JTAG controller (not shown) during sub-assembly. However, JTAG does not provide mechanisms for testing HV analog ICs 304 and pins. In accordance with the subject innovation, the HV analog IC 304 includes a built in self test (BIST) component 308 that enables sub-assembly testing of the HV analog IC 304 and pins. The BIST component 308 is invoked via a serial register accessible interface 310 that represents a mapping of pins to register bits of the HV analog IC 304.

It is to be appreciated that the subject diagram is illustrated for brevity and simplicity of explanation. In practice the embodiment is not so limited, for example, the HV analog ICs 304 can include mixed signal ICs containing both digital and analog pins (e.g., low and/or high voltage). A typical mixed signal IC can have forty (40) to seventy (70) pins, including up to 6 or more classes of pins. For instance, a common type of mixed signal IC can include four (4) serial interface pins, six (6) low voltage analog pins, thirty (30) HV analog pins, four (4) digital I/O pins, four (4) power/ground pins, and a set of pins for internal monitors. As discussed previously, JTAG does not provide for testing of HV analog pins, and as a result is not effective for testing high quantities of HV analog pins typically contained in mixed signal ICs.

As discussed in greater detail below, the BIST component 308 is essentially a state machine that analyzes the connector values and compares them to a set of predetermined values. The predetermined values can be stored in a register on the HV analog IC 304. In other words, the BIST component 308 incorporates diagnostic capabilities into the HV analog IC 304 (e.g., mixed signal ICs).

Figure 4:
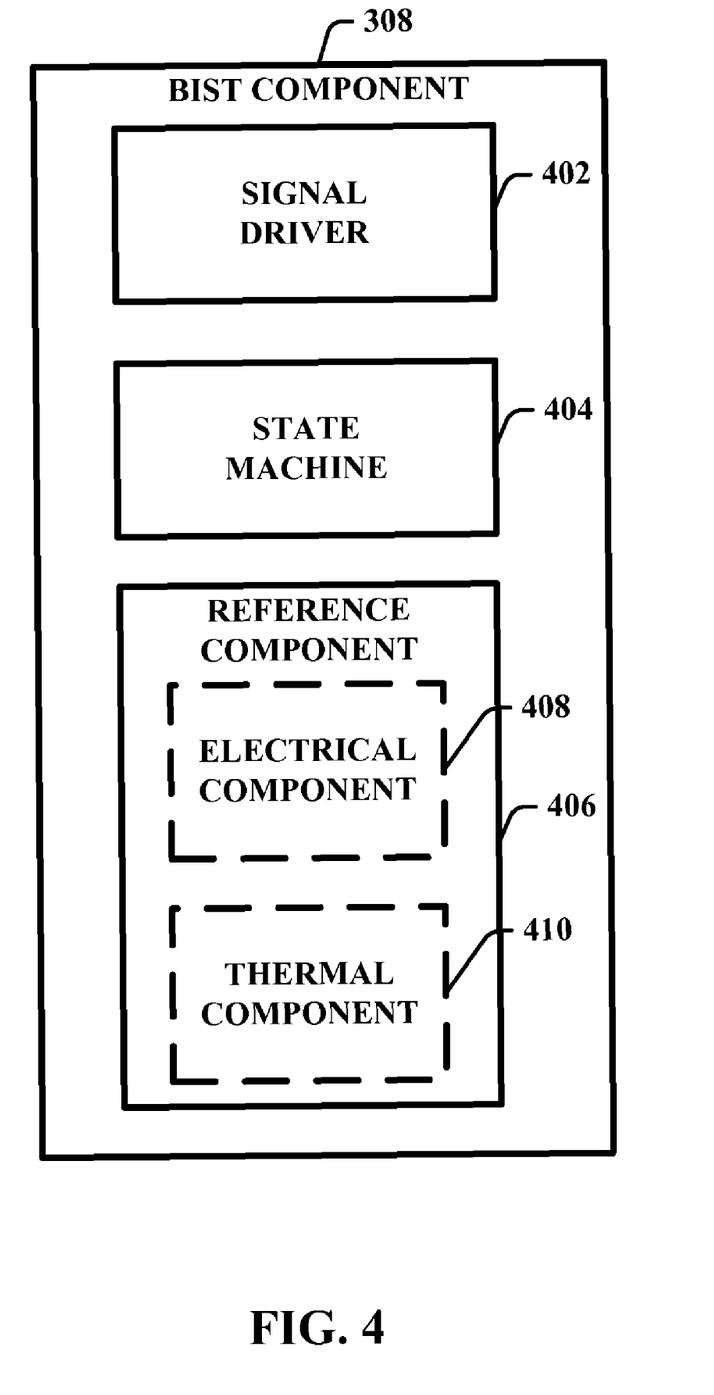
FIG. 4 illustrates an example built in self test component in accordance with an aspect of the subject specification.

FIG. 4 illustrates an example built in self test component in accordance with an aspect of the subject innovation. As discussed previously, the built in self test (BIST) component 308 enables integrated testing of HV analog ICs and pins. For example, the BIST component 308 can be used to detect a plurality of fault classes, including but not limited to pins that are shorted to ground, pins that are shorted to a power rail, floating pins, pins shorted to adjacent pins, and so forth. The BIST component 308 includes a signal driver 402, a state machine 404, and a reference component 406.

The signal driver 402 can include, by way of example, a driving LED, that produces an electronic load to test for the fault classes discussed above. The electronic load can be injected, transmitted, or otherwise communicated to one or more pins of an IC. The state machine 404 compares, evaluates, or otherwise analyzes the response of the IC to the electronic load produced by the signal driver 402. For example, the state machine can identify dry solders, bridge solders, and so forth by comparing the response of the IC to a set of predetermined responses.

Figure 5:
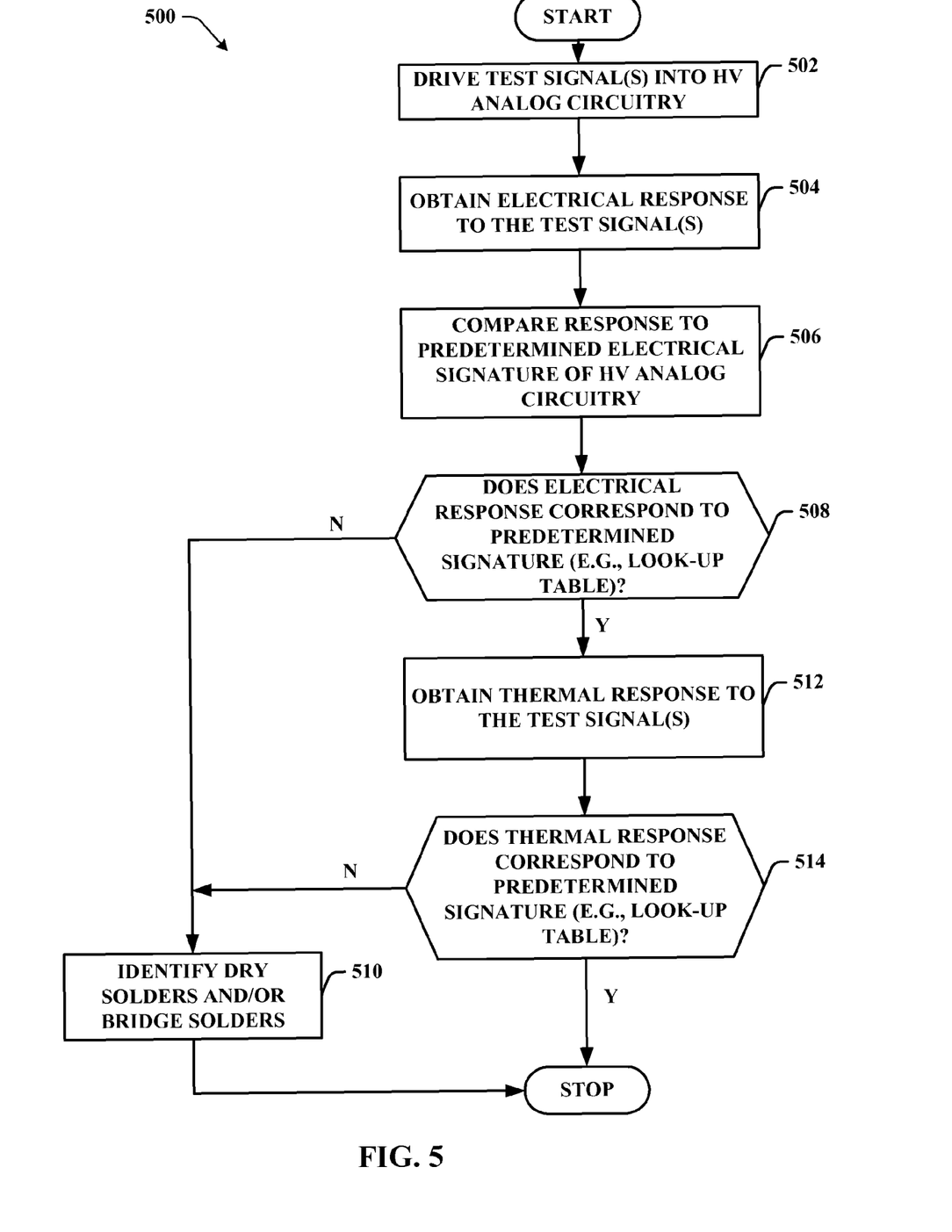
FIG. 5 illustrates an example methodology of detecting faults in high voltage integrated circuits in accordance with an aspect of the subject specification.

Table 1 below is an example table of permutations illustrating a set of fault types that can be determined based on PIN placement in a mixed signal IC (discussed supra). For example, in one embodiment, a fault at a high voltage analog pin (e.g., high voltage input/output pin, HV I/O pin, etc.) can be determined via the BIST component 308, when the HV analog pin is located next to a power pin (e.g., power 1 or power 2), a ground pin, a low voltage (LV) analog pin, and so forth. As discussed previously, the classes of faults that can be determined include pins shorted to ground, pins shorted to a power rail, floating pins (e.g., unconnected), and pins shorted to adjacent pins.

disclosed subject matter will be better appreciated with reference to the flow chart of FIG. 5. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter.

Turning now to FIG. 5, an example methodology of detecting faults in high voltage integrated circuits is illustrated in accordance with an aspect of the subject innovation. At 502, one or more test signals are driven into the pins of a set of HV analog circuits. As discussed above, an LED signal driver, for example, can be used to generate and communicate the test signals to one or more pins (e.g., connectors) of a set of HV analog circuits. At 504, the electrical response of the HV analog circuits is obtained from the pins. At 506, the obtained electrical response of the HV analog circuit is compared to a set of predetermined expected electrical responses for a given set of test signals.

At 508, an error is determined based on the comparison of the obtained electrical responses to the predetermined expected responses. If the obtained electrical response does not correspond to the expected electrical response (e.g., electrical signature), or is not within a predetermined threshold, then at 510 one or more dry solders and/or bridge solders can be determined. If the obtained electrical response does correspond to the expected electrical response, then at 512 the thermal response to the test signals can be obtained. At 514, if the obtained thermal response does not correspond to the expected thermal response (e.g., thermal signature), or is not within a predetermined threshold, then at 510 one or more dry solders and/or bridge solders can be determined. Otherwise, the testing is complete and the IC has passed the quality assessment without identifying faults or errors.

TABLE 1

| Mixed Signal Pins | Power 1 | GND | LV Analog | Input Digital | Output Digital | I/O Digital | HV I/O, O | Power 2 |
|---|---|---|---|---|---|---|---|---|
| Power 1 |  | X | X |  | X | X | X |  |
| GND | X |  | X | X | X | X | X | X |
| LV Analog |  | X |  |  |  |  | X | X |
| Input Digital |  | X |  |  | X | X |  |  |
| Output Digital | X | X | X | X |  | X | X | X |
| I/O Digital | X | X | X | X | X | X | X | X |
| HV I/O, O | X | X | X |  | X | X |  | X |
| Power 2 |  | X |  |  | X | X | X |  |

The predetermined responses can be maintained by the reference component 406. The reference component 406 includes an electrical component 408, and a thermal component 410. The electrical component 408 can maintain a set of predetermined expected electrical responses to a plurality of electronic loads, and the thermal component 410 can maintain a set of predetermined expected thermal responses to a plurality of electronic loads. The expected responses can be maintained, for example, as tables (e.g., look-up tables), matrices, and so forth. When the expected electrical or thermal response does not correspond to the predetermined expected response the BIST component 308 can determine that a fault has occurred.

Figure 6:
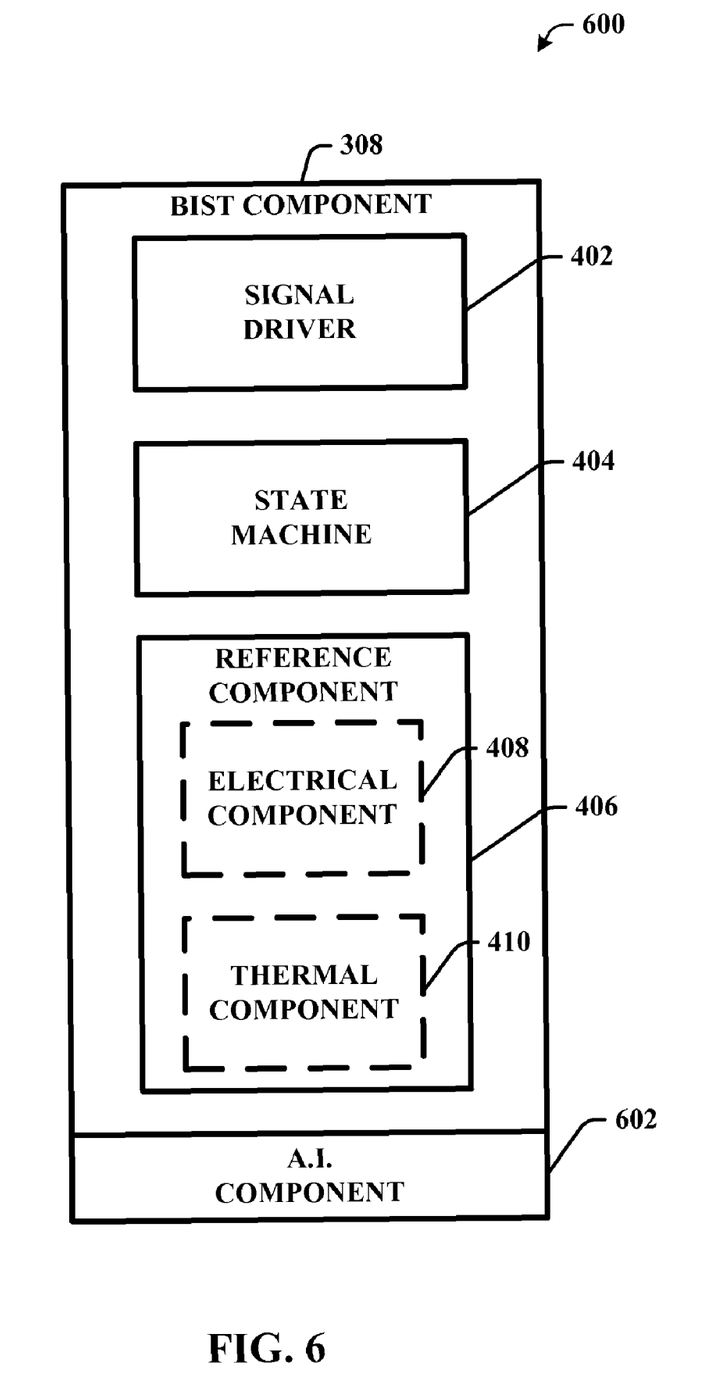
FIG. 6 illustrates a system that employs an artificial intelligence component which facilitates automating one or more features in accordance with the subject specification.

In view of the example systems described supra, methodologies that may be implemented in accordance with the FIG. 6 illustrates a system 600 that employs an artificial intelligence (AI) component 602 which facilitates automating one or more features in accordance with the subject innovation. The subject innovation (e.g., in connection with inferring) can employ various AI-based schemes for carrying out various aspects thereof. For example, a process for analyzing electrical and/or thermal responses to test signals can be facilitated via an automatic classifier system and process.

As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Furthermore, inference can be based upon logical models or rules, whereby relationships between components or data are determined by an analysis of the data and drawing conclusions there from. For instance, by observing that one user interacts with a subset of other users over a network, it may be determined or inferred that this subset of users belongs to a desired social network of interest for the one user as opposed to a plurality of other users who are never or rarely interacted with.

Directed and undirected model classification approaches including, for example, naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated from the subject specification, the subject innovation can employ classifiers that are explicitly trained (e.g., via a generic training data) as well as implicitly trained (e.g., via observing user behavior, receiving extrinsic information). Thus, the classifier(s) can be used to automatically learn and perform a number of functions, including but not limited to determining according to a predetermined criteria when to update or refine the previously inferred schema, tighten the criteria on the inferring algorithm based upon the kind of data being processed (e.g., financial versus non-financial, personal versus non-personal . . . ), and at what time of day to implement tighter criteria controls (e.g., in the evening when system performance would be less impacted).

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. An apparatus for sub-assembly error detection in high voltage analog circuits, comprising:
   a serial register accessible interface, wherein the serial register accessible interface exhibits a mapping of pins to register bits of a high voltage analog circuit; and
   a built in self test component that is included in the high voltage analog circuit and invoked via the serial register accessible interface, the built in self test comprising:
      a signal driver that generates a set of electrical test signals, and communicates the test signals to one or more pins of the high voltage analog circuit, wherein high voltage includes voltages of five volts or higher,
      a reference component that maintains a set of expected responses to the test signals for the high voltage analog circuit, and
      a state machine that obtains an actual response of the high voltage analog circuit to the test signals, and determines existence of an error by comparing the actual response to the set of expected responses maintained by the reference component.

2. The apparatus of claim 1, wherein the state machine determines the existence of an error if the actual response is not within a predetermined threshold of the expected response.

3. The apparatus of claim 1, the reference component includes an electrical component that maintains a set of predetermined expected electrical responses to the test signals.

4. The apparatus of claim 1, the reference component includes a thermal component that maintains a set of predetermined expected thermal responses to the test signals.

5. The apparatus of claim 1, wherein the errors include at least one of a dry solder or a bridge solder.

6. The apparatus of claim 1, wherein the signal driver is an LED driver.

7. The apparatus of claim 1, further comprising an artificial intelligence component that facilitates automating one or more features of the apparatus.

8. The apparatus of claim 1, wherein the built in self test determines the existence of at least one fault, the faults including at least one of stuck-low, stuck-high, floating pin, or adjacent pin bridging.

9. A method for error detection in high voltage analog circuits, comprising:
   indicating a mapping of pins to register bits of a high voltage analog circuit via a serial register accessible interface;
   generating a set of electrical test signals;
   communicating the test signals to one or more pins of the high voltage analog circuit, wherein high voltage includes voltages of five volts or higher;
   maintaining at least one of a set of expected electrical responses or a set of expected thermal responses to the test signals;
   obtaining an actual response of the high voltage analog circuit to the test signals;
   determining existence of at least one error by comparing the actual response to the set of expected responses; and
   identifying at least one fault via a built in self test that is included in the high voltage analog circuit, wherein the built in self test is called via the serial register accessible interface.

10. The method of claim 9, wherein determining the existence of at least one error further comprises determining if the actual response is within a predetermined threshold of the expected electrical or thermal responses.

11. The method of claim 9, wherein the errors include at least one of a dry solder or bridge solder.

12. The method of claim 9, further comprising automating at least one of determining existence of an error, or maintaining at least one of a set of expected electrical responses or a set of expected thermal responses to the test signals via artificial intelligence.

13. The method of claim 9, the faults include at least one of stuck-low, stuck-high, floating pin, or adjacent pin bridging.

14. An apparatus, comprising:
   means for identifying at least one fault via a built in self test that is included in a high voltage analog circuit and launched via a serial register accessible interface, the serial register accessible interface representing a mapping of pins to register bits of the high voltage analog circuit, the means for identifying comprising:
      means for generating a set of electrical test signals, means for communicating the test signals to one or more pins of the high voltage analog circuit, wherein high voltage includes voltages of five volts or higher, means for maintaining at least one of a set of expected electrical responses or a set of expected thermal responses to the test signals, means for obtaining an actual response of the high voltage analog circuit to the test signals, and means for determining existence of at least one error by comparing the actual response to the set of expected responses.

15. The apparatus of claim 14, wherein the means for determining existence of at least one error further comprises means for determining if the actual response is within a predetermined threshold of the expected electrical or thermal responses.

16. The apparatus of claim 14, wherein the errors include at least one of a dry solder or bridge solder.

17. The apparatus of claim 14, further comprising means for automating at least one of determining existence of an error, or maintaining at least one of a set of expected electrical responses or a set of expected thermal responses to the test signals via artificial intelligence.

18. The apparatus of claim 14, wherein the faults include at least one of stuck-low, stuck-high, floating pin, or adjacent pin bridging.

* * * * *

UNITED STATES PATENT AND TRADEMARK OFFICE
CERTIFICATE OF CORRECTION

PATENT NO.        : 8,222,910 B2
APPLICATION NO.   : 12/504308
DATED             : July 17, 2012
INVENTOR(S)       : Dilip Sangam It is certified that error appears in the above-identified patent and that said Letters Patent is hereby corrected as shown below:

In column 8, line 58: In claim 13, before "the" insert -- wherein --.

Signed and Sealed this
Second Day of October, 2012

David J. Kappos
*Director of the United States Patent and Trademark Office*